United States Patent [19]
Kime et al.

[11] 3,757,241
[45] Sept. 4, 1973

[54] A.C. AMPLIFIER HAVING D.C. BIAS STABILIZATION

[75] Inventors: Robert C. Kime, Fairview Park; Pieter C. Cath, Aurora, both of Ohio

[73] Assignee: Keithley Instruments, Inc., Solon, Ohio

[22] Filed: Nov. 24, 1971

[21] Appl. No.: 201,697

[52] U.S. Cl. .......... 330/30 D, 330/9, 330/69
[51] Int. Cl. .......... H03f 3/68
[58] Field of Search .......... 307/235; 330/30 D, 330/69, 35, 9, 109

[56] References Cited

UNITED STATES PATENTS

| | | | |
|---|---|---|---|
| 3,553,492 | 1/1971 | Bugay | 307/235 |
| 3,629,719 | 12/1971 | Heller | 330/69 |
| 3,624,533 | 11/1971 | Schiff | 330/35 X |

*Primary Examiner*—Roy Lake
*Assistant Examiner*—Lawrence J. Dahl
*Attorney*—Yount & Tarolli

[57] ABSTRACT

An A.C. amplifier is disclosed having first and second A.C. amplifier sections each including a high input impedance stage followed by an output stage, with the output stages of the two amplifier sections being D.C. coupled to an output amplifier. A first stabilizing circuit serves to stabilize the D.C. bias of one of the amplifier sections and a second stabilizing circuit serves to stabilize the D.C. bias of the other amplifier's section in dependence upon the D.C. level of the output amplifier. The D.C. bias stabilization circuitry permits use of input stages, such as field effect transistors, which are not matched in their D.C. characteristics while still maintaining low noise characteristics.

11 Claims, 1 Drawing Figure

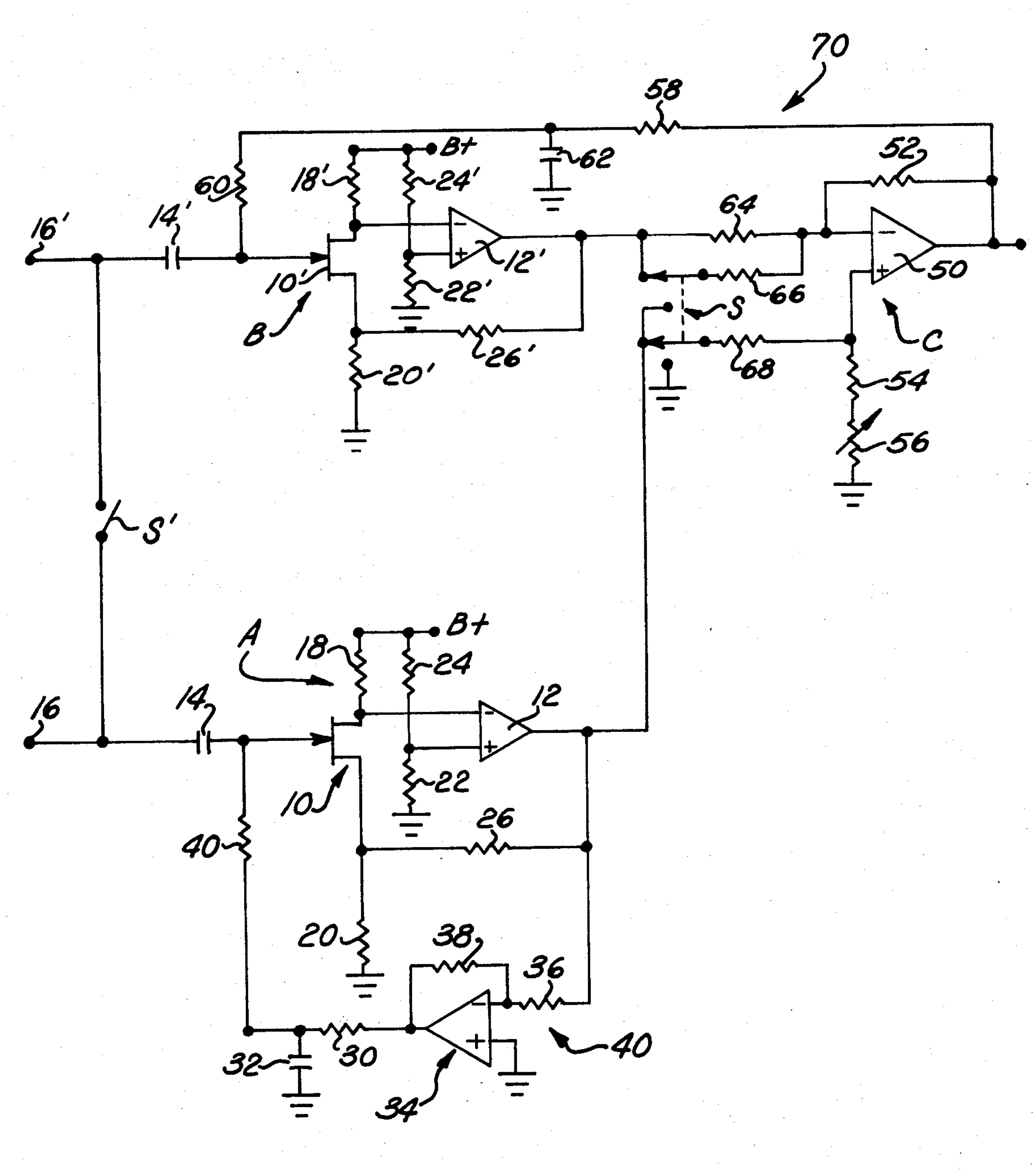
INVENTORS
ROBERT C. KIME
PIETER G. CATH
BY Young and Tarolli
ATTORNEYS

A.C. AMPLIFIER HAVING D.C. BIAS STABILIZATION

This invention relates to the art of A.C. amplifiers and, more particularly, to an improved high gain, low noise amplifier having D.C. bias stabilization.

The invention is particularly applicable for use as a single ended input or differential configuration amplifier serving as an oscilloscope preamplifier or a phase sensitive detector preamplifier; although, the invention is not limited thereto as it may be used in various applications employing A.C. amplifiers where D.C. bias stabilization is desired.

In applications where A.C. signals are to be amplified, such as for an oscilloscope or a phase sensitive detector, it is desirable that the amplification be obtained with minimum noise. Also depending on the application involved, the preamplifier should be either single ended or in a differential configuration. It is known that the noise in an A.C. amplifier may be reduced with a two stage amplifier construction having a high input impedance first stage amplifier, such as with the use of a field effect transistor, and an operational amplifier for the second stage. In a differential configuration, however, this normally entails the use of low noise, high input impedance, field effect transistors which must be matched for their respective D.C. characteristics. This, of course, increases the expense of such an amplifier.

It is a primary object of the present invention to provide an improved high gain, low noise, A.C. amplifier which does not require the use of matched input devices, such as field effect transistors.

Another object of the present invention is to provide an improved high gain, A.C. amplifier employing circuitry for obtaining D.C. bias stabilization.

A still further object of the present invention is to provide a D.C. bias stabilized, high gain. A.C. amplifier which may be configured for operation in either a single ended input mode or a dual ended input mode.

A still further object of the present invention is to provide a D.C. bias stabilized, high gain, A.C. amplifier employing a pair of A.C. amplifiers connected together in parallel to decrease voltage noise.

A still further object of the present invention is to provide a high gain, A.C. amplifier having a pair of A.C. amplifier sections which are connected to a summing amplifier with direct current passing circuits and wherein D.C. bias stabilization is obtained.

In accordance with the present invention, a pair of A.C. amplifiers are provided each including a high input impedance amplifier device, such as a field effect transistor, having an input circuit for receiving an A.C. input signal to be amplified and an output circuit connected across a D.C. bias source, and exhibiting the characteristic of being non-conductive when the D.C. level at the input circuit is below a given bias level and increasingly more conductive as the D.C. level increases above the given bias level. Each of the A.C. amplifiers also employs a comparing circuit for comparing a first D.C. level obtained from the amplifier device output circuit with a reference second D.C. level. One of the A.C. amplifiers is provided with a first stabilizing circuit which serves to apply a first stabilizing D.C. level signal to the input circuit of its associated amplifier device to effectively vary a given bias level thereof in a direction tending to decrease any difference in signal levels between the first and second D.C. signal levels. Also, a second stabilizing circuit is provided for purposes of applying a second stabilizing D.C. level signal to the input circuit of the other amplifier device in dependence upon the D.C. levels of the third D.C. level signals obtained from the first and second amplifiers.

In accordance with a more limited aspect of the present invention, a common comparison circuit is provided for comparing the third D.C. level signals obtained from the first and second amplifiers, and providing in dependence upon the comparison an output D.C. level signal for use in stabilizing one of the A.C. amplifiers.

In accordance with a still further aspect of the present invention, the common comparing circuit takes the form of a differential amplifier which is D.C. coupled to the output circuits of the first and second A.C. amplifiers.

In accordance with a still further aspect of the present invention, the first and second A.C. amplifiers are connected together in parallel for minimizing voltage noise and the third signals obtained from the two amplifiers are applied to a common summing amplifier which serves to provide an output D.C. level signal for stabilizing one of the A.C. amplifiers in dependence upon the summation of the third D.C. level signals.

In accordance with a still further aspect of the present invention, switching circuitry is provided for selectively connecting or disconnecting the two A.C. amplifiers in parallel and for connecting the output circuits thereof to an output amplifier having input circuitry switched so as to serve as either a differential amplifier or a summing amplifier.

The foregoing and other objects and advantages of the invention will become more readily apparent from the following description of the preferred embodiment of the invention read in conjunction with the accompanying patent drawing which includes a single feature illustrating a combined schematic-block diagram illustration of the preferred embodiment of the invention.

Referring now to the patent drawing wherein the showings are for purposes of illustrating a preferred embodiment of the invention only and not for purposes of limiting same, there is illustrated in combined schematic-block diagram form a D.C. bias stabilized, high gain A.C. amplifier. The amplifier generally includes a pair of high input impedance A.C. amplifiers A and B and a relatively low input impedance output amplifier C.

Reference is now made specifically to amplifier A, which is a two stage A.C. amplifier employing a high input impedance first stage amplifier, including a field effect transistor 10, and a second lower input impedance differential operational amplifier 12. Transistor 10 has its gate connected to a coupling capacitor 14 to receive an A.C. input signal applied to terminal 16. The output circuit of transistor 10 is connected across a D.C. bias source in that the drain electrode is connected through a resistor 18 to a B+ voltage supply source, whereas the source electrode is connected through a resistor 20 to ground. A voltage divider including resistors 22 and 24 is connected between ground and the B+ voltage supply source, with the junction between these two resistors connected to the noninverting input of operational amplifier 12. The drain electrode of transistor 10 is connected to the inverting input of operational amplifier 12.

Amplifier A is provided with a resistive feedback path including a resistor 26 connected between the output of operational amplifier 12 and the junction of resistor 20 and the source electrode of transistor 10. Thus, the A. C. gain of amplifier A is dictated by the sum of the resistance value of resistors 20 and 26 divided by the resistance value of resistor 20. In the preferred embodiment of the invention this gain should be on the order of ten. It is preferred that amplifier A have a relatively low level, low cut frequency on the order of approximately 0.01 cycles per second. This may be accomplished by placing a capacitor between resistor 20 and ground. However, to provide an A.C. gain of 10, resistor 20 must be substantially smaller than that of resistor 26. This, of course, requires a relatively large capacitor if a capacitor is placed in series with resistor 20 to ground. For example, if resistor 20 has a value on the order of 200 ohms, then such a capacitor, to obtain a low cut frequency of 0.01 cycles per second, would be on the order of 8,000 microfarads. This is a relatively bulky and expensive capacitor.

Instead of placing a large capacitor in series between resistor 20 and ground, a relatively large valued resistor 30 is connected in a feedback path between the output circuit of amplifier 12 and the gate of transistor 10. Since it is the RC time constant of concern in determining the value of the capacitance to be employed for amplifier A, the use of a large valued resistor 30 permits the use of a relatively low value capacitor 32, which is connected between one end of resistor 30 and ground. An inverting operational amplifier 34 is connected between amplifier 12 and resistor 30 together with its input resistor 36 and its feedback resistor 38. The junction of resistor 30 and capacitor 32 is connected through a resistor 40 to the gate of transistor 10. This feedback path between the output of amplifier 12 and the gate of transistor 10 serves as a stabilizing circuit 40 for stabilizing the D.C. bias level of amplifier A.

The manner in which the D.C. bias level of amplifier A is stabilized will now be described. It is desirable that the D.C. bias for the field effect transistor 10 be such that the transistor will operate at a fixed drain current and a fixed drain to source voltage. Assume that the B+ voltage supply source provides 15 volts positive, and that the potential on the drain electrode of transistor 10 is 4 volts, whereas the voltage divider applies 5 volts to the noninverting input of amplifier 12. Since the input signal to the inverting input of operational amplifier 12 is 1 volt more negative than that on the noninverting input, a positive D.C. level signal will appear on the output circuit of amplifier 12 proportional to the difference but increased in accordance with the amplifier's gain. This positive signal is applied to the stabilizing circuit 40 where it is inverted by amplifier 34 so as to supply a negative D.C. level signal to the gate of transistor 10. This more negatively biases the gate of transistor 10 so that it tends to become less conductive causing the potential at its drain electrode to increase toward that of the level of the potential applied to the noninverting input of amplifier 12.

A.C. amplifier B is constructed in a manner quite similar to that of amplifier A and, consequently, like components in amplifier B are identified with like character reference numbers which are primed. Amplifier B, however, is not provided with a stabilizing circuit of its own, as in the case of stabilizing circuit 40 associated with amplifier A. The stabilization of the D.C. bias level of amplifier B is attained in dependence upon the stabilization of amplifier A and the method is dependent upon whether the circuit is being utilized in a differential mode or a single ended mode, both of which will be described in greater detail below.

Output amplifier C includes a relatively low input impedance operational amplifier 50 having a resistive feedback path including a resistor 52 connected between its output circuit and its inverting input circuit. The noninverting input circuit of amplifier 50 is connected through a resistor 54 and a common mode adjustment potentiometer 56 to ground. A feedback path is connected between the output circuit of amplifier 50 and the gate of field effect transistor 10', and this feedback path includes a pair of series connected resistors 58 and 60 together with a capacitor 62 connected between the junction of these two resistors and ground. A ganged two pole switch S serves to connect the output amplifier C to amplifiers A and B in either a single ended input mode or a differential input mode during which output amplifier C serves respectively as a summing amplifier or a differential amplifier. In the differential mode switch S serves to connect a pair of resistors 64 and 66 together in parallel between the output circuit of amplifier B and the inverting input circuit of amplifier C. Also during this mode, switch S serves to connect the output circuit of amplifier A through a resistor 68 to the noninverting input circuit of amplifier 50. In the single ended mode switch S is actuated to a position wherein resistor 68 is connected to ground and resistor 66 is connected to the output circuit of amplifier A. An additional switch S' is provided for connecting terminals 16 and 16' together for single ended input operation, and when the switch is open to provide a differential configuration.

As previously discussed, amplifier A and, hence, amplifier B are provided with feedback circuits so that each exhibits a gain of 10. This is also true for amplifier C. Thus, resistors 52 and 54 are of equal value and are substantially greater than resistors 64, 66 or 68. The resistance of resistors 64 and 66 are equal but are each twice as great as that of resistor 68. Thus, when resistors 64 and 66 are connected in parallel during the differential mode a resistance equal to that of resistor 68 is presented. The ratio of the resistance of resistor 52 to that of either resistor 68 or to that of the parallel connected resistors 64 and 66 is on the order of 10, so that a gain of 10 is presented by amplifier C to the output of amplifier A or that of amplifier B. In the differential mode, since only resistors 64 and 66 are employed, a gain of five is presented by amplifier C to the outputs of amplifiers A and B.

In the differential mode of operation; to wit, with switch S' being open and switch S being in the position as shown in the patent drawings, output amplifier C serves as a comparing means or differential amplifier. It will be recalled from the previous discussion relative to the D.C. bias stabilization for amplifier A, that a positive D.C. level signal was provided on the output circuit of operational amplifier 12. That signal was used for purposes of obtaining D.C. bias stabilization of amplifier A. This signal is also applied in the differential mode of operation to the noninverting input of operational amplifier 50. Assume for the moment that the D.C. potential on both the inverting and noninverting inputs of operational amplifier 12' are the same level, then the D.C. output level of amplifier B is substantially at ground potential. Consequently then, operational amplifier 50 will amplify the positive D.C. level signal from amplifier A without inversion. This positive D.C. level signal is applied through the feedback circuit including resistors 58 and 60 which form the second stabilizing circuit 70 to the gate of field effect transistor 10'. This positive increase in the D.C. level to the gate of transistor 10' will cause this transistor to become more conductive, and thereby cause the D.C. level on its drain electrode to decrease. As this decreased D.C. level is applied to the inverting input of operational amplifier 12', a positive level signal will be produced. The positive level signal obtained from operational amplifier 12' tends to approach the positive level signal appearing on the output of operational amplifier 12.

Consequently, in the differential mode of operation the output amplifier C and stabilization circuit 70 serve to stabilize the D.C. bias level of the A.C. amplifier by driving the D.C. output level of amplifier B to the same polarity and magnitude as that of amplifier A. Since operational amplifier 50 is serving as a differential amplifier in this mode of operation, the like polarity and like magnitude D.C. level signals are substantially on the output of amplifier 50, leaving a slight negative bias, so that the amplifier A.C. signal will swing substantially symmetrically about ground potential. If, for example, the circuitry is configured for an A.C. voltage swing between plus and minus 10 volts, then this stabilization circuitry permits a nearly symmetrical swing of the A.C. signal about ground potential within substantially the full permissible range.

In the single ended, input mode of operation switch S' is closed and switch S is manipulated so that resistor 68 is connected to ground and resistor 66 is connected to the output of amplifier A. In this mode of operation amplifier C presents a gain of five to the output of amplifier A as well as to that of amplifier B. Operational amplifier 50 is now configured to operate as a summing amplifier. As in the previous example, it will be assumed that the output of amplifier A carries a positive bias level signal. This signal is applied to the inverting input of operational amplifier 50 so that its output circuit carries a negative D.C. level signal. This negative D.C. level signal is applied to the gate of field effect transistor 10' to decrease its D.C. bias. Consequently, transistor 10' becomes less conductive to thereby increase the potential at its drain electrode. This tends to force the output of operational amplifier 12' to attain a negative D.C. level of a magnitude equal to that on the output of operational amplifier 12. As both of these signals are applied to amplifier 50, now serving as a summing amplifier, the two signals will be summed so that the output of amplifier 50 will tend to approach ground potential. Consequently, as in the case with the differential mode of operation, the circuitry has been stabilized so that the amplifier A.C. signal will be substantially symmetrical about ground potential.

The invention herein has been described with reference to a particular preferred embodiment, although it is to be appreciated that the invention is not limited to same as various modifications and arrangement of parts will occur to those skilled in the art within the scope and spirit of the appended claims.

What is claimed is:

1. A D.C. bias stabilized A.C. amplifier comprising first and second high input impedance A.C. amplifiers each including a high input impedance amplifier device having an input circuit for receiving an A.C. input signal to be amplified and an output circuit connected across a D.C. bias source and exhibiting the characteristic of being nonconductive when the D.C. level at said input circuit is below a given bias level and increasingly more conductive as said D.C. level increases above said given bias level, each said output circuit carrying a first D.C. level signal which varies in dependence upon the conductive level of said device; and, first and second comparing means for respectively comparing a different one of said first D.C. level signals with a reference second D.C. level signal and each said comparing means providing a third D.C. level signal in dependence upon said respective comparisons;

one of said A.C. amplifiers having first stabilizing means for applying a first stabilizing D.C. level signal to the said input circuit of its said device to effectively vary the said given bias level thereof in a direction tending to decrease any difference in signal levels between its said first and second D.C. signal levels; and second stabilizing circuit means for applying a second stabilizing D.C. level signal to the input circuit of said other amplifier device in dependence upon the D.C. levels of both of said third D.C. level signals.

2. An A.C. amplifier as set forth in claim 1 wherein each said comparing means includes A.C. amplifying means for amplifying the A.C. signal component carried by the output circuit of its associated said amplifier device.

3. An A.C. amplifier as set forth in claim 2 wherein each said comparing means includes a differential amplifier for providing a said third D.C. level signal carrying an amplified A.C. signal component.

4. An A.C. amplifier as set forth in claim 1 including common comparing means interposed between both of said comparing means and said second stabilizing circuit means for providing an output D.C. level signal dependent upon a comparison of both said third D.C. level signals.

5. An A.C. amplifier as set forth in claim 4 wherein said second stabilizing circuit means is connected between the output of said common comparing means and the input circuit of said amplifier device of said other A.C. amplifier for applying said second stabilizing D.C. level signal thereto to stabilize the D.C. bias level thereof so that the third D.C. level signal of said other A.C. amplifier approaches that of said one A.C. amplifier.

6. An A.C. amplifier as set forth in claim 5 wherein said common comparing means includes a differential amplifier.

7. An A.C. amplifier as set forth in claim 6 wherein the output circuits of said first and second A.C. amplifiers are connected to the inputs of said differential amplifiers with direct current passing circuits.

8. An A.C. amplifier as set forth in claim 1 including common summing amplifier means interposed between both of said comparing means and said second stabilizing circuit means for providing an output D.C. level signal dependent upon the summation of both said third D.C. level signals.

9. An A.C. amplifier as set forth in claim 8 wherein said second stabilizing circuit means is connected between the output of said summing amplifier means and the input circuit of said amplifier device of said other A.C. amplifier for applying said second stabilizing D.C. level signal thereto to stabilize the D.C. bias level thereof so that the third D.C. level signal of said other A.C. amplifier is of opposite polarity from and approaches the magnitude of that of said one A.C. amplifier.

10. An A.C. amplifier as set forth in claim 9 wherein the output circuits of said first and second A.C. amplifiers are connected to the input of said summing amplifier means with direct current passing circuits.

11. An A.C. amplifier as set forth in claim 10 including means for connecting said first and second A.C. amplifiers in parallel to thereby reduce voltage noise while defining a single ended input A.C. amplifier circuit.

* * * * *